United States Patent
Saito et al.

(10) Patent No.: US 10,591,567 B2
(45) Date of Patent: Mar. 17, 2020

(54) IMAGE PROCESSING APPARATUS AND MAGNETIC RESONANCE IMAGING APPARATUS

(71) Applicant: TOSHIBA MEDICAL SYSTEMS CORPORATION, Otawara-shi, Tochigi (JP)

(72) Inventors: Kanako Saito, Kanagawa (JP); Hidenori Takeshima, Kanagawa (JP)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 172 days.

(21) Appl. No.: 14/835,077

(22) Filed: Aug. 25, 2015

(65) Prior Publication Data
US 2016/0063738 A1  Mar. 3, 2016

(30) Foreign Application Priority Data
Aug. 26, 2014 (JP) .................. 2014-172066

(51) Int. Cl.
*G01R 33/563* (2006.01)
*G01R 33/56* (2006.01)

(52) U.S. Cl.
CPC ... *G01R 33/56316* (2013.01); *G01R 33/5608* (2013.01)

(58) Field of Classification Search
CPC .............. G01R 33/5608; G01R 33/56316
See application file for complete search history.

(56) References Cited

U.S. PATENT DOCUMENTS 3,163,570 A    12/1964  Brundage
6,208,139 B1 *  3/2001  Foo ................... G01R 33/561
                                                              324/307
(Continued)

FOREIGN PATENT DOCUMENTS

JP    9-294734    11/1997
JP    11-99136     4/1999
(Continued)

OTHER PUBLICATIONS

Tsao, J. et al., "k-t BLAST and k-t SENSE: Dynamic MRI With High Frame Rate Exploiting Spatiotemporal Correlations," MRM, vol. 50, pp. 1031-1042, 2003.
(Continued)

*Primary Examiner* — Nirav G Patel
(74) *Attorney, Agent, or Firm* — Nixon & Vanderhye P.C.

(57) ABSTRACT

An image processing apparatus according to an embodiment includes conversion circuitry, magnitude image generating circuitry and phase image generating circuitry. The conversion circuitry is configured to convert time-series k-space data into first time-series x-space data, the x-space representing a spatial position. The magnitude image generating circuitry is configured to generate a magnitude image from second time-series x-space data, the second time-series x-space data being acquired by applying a first filter to the first time-series x-space data. The phase image generating circuitry is configured to generate a phase image from third time-series x-space data, the third time-series x-space data being acquired by applying, to the first time-series x-space data, a second filter that is different from the first filter.

7 Claims, 7 Drawing Sheets

(56) References Cited

U.S. PATENT DOCUMENTS

2009/0161934 A1* 6/2009 Zhao ................ G01R 33/56316
  382/131
2015/0028872 A1  1/2015 Takeshima
2015/0117735 A1* 4/2015 Park .................. G01R 33/5611
  382/131
2015/0276908 A1  10/2015 Takeshima

FOREIGN PATENT DOCUMENTS

JP        3163570      5/2001
JP        2014-69007   4/2014
JP        2015-181840  10/2015

OTHER PUBLICATIONS

Doyle, et al., "Real-time movie image enhancement in NMR", Journal of Physics, 1986, vol. 19, pp. 439-444.

* cited by examiner

INVERSION OF FIRST
GRADIENT FIELD

GENERATE FIRST DATA

INVERSION OF SECOND
GRADIENT FIELD

GENERATE SECOND DATA

GRADIENT FIELD

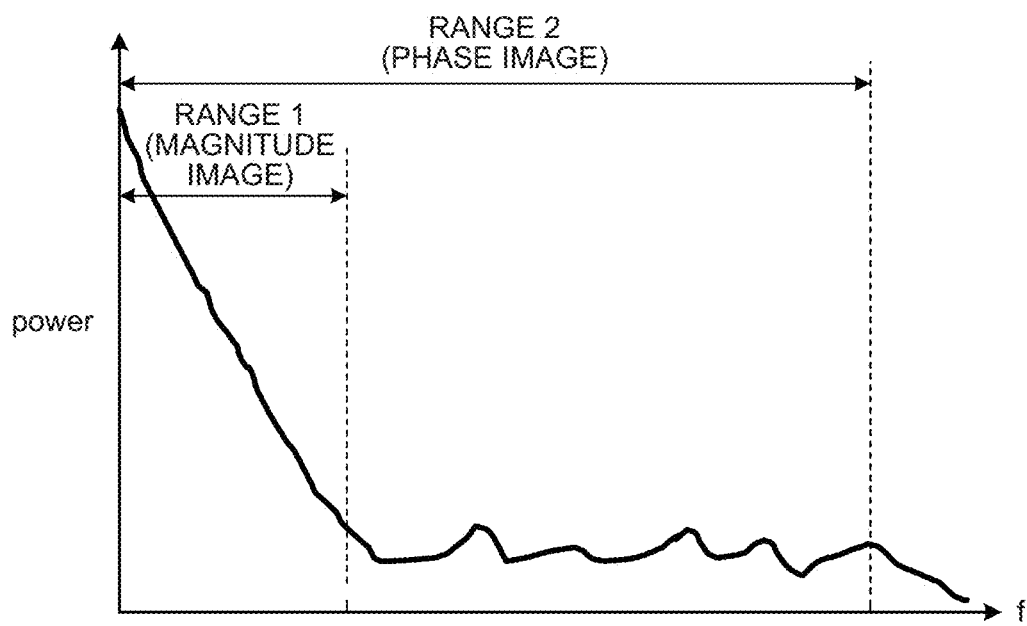

IMAGE PROCESSING APPARATUS AND MAGNETIC RESONANCE IMAGING APPARATUS

CROSS-REFERENCE TO RELATED APPLICATIONS

This application is based upon and claims the benefit of priority from Japanese Patent Application No. 2014-172066, filed on Aug. 26, 2014; the entire contents of which are incorporated herein by reference.

FIELD

Embodiments described herein relate generally to an image processing apparatus and a magnetic resonance imaging apparatus.

BACKGROUND

A magnetic resonance imaging apparatus (MRI apparatus) is an apparatus that images internal information of a subject by using a nuclear magnetic resonance phenomenon. An MRI apparatus acquires, with a coil, data referred to as k-space data by sampling nuclear magnetic resonance signals (MR signals) from certain atomic nuclei (e.g., atomic nuclei of hydrogen atoms) in the subject and acquires an MR image by applying the Fourier transform to the k-space data.

The MR signals are sampled as one-dimensional data. In order to acquire a two-dimensional MR image or a three-dimensional MR image, the MRI apparatus repeatedly performs one-dimensional sampling in a k-space, thereby acquiring necessary data for generating MR images. When a k-space data is sampled at the same resolution (full sampling) as that of an output MR image, by applying the Fourier transform to the acquired k-space data, generation of an MR image becomes possible. Furthermore, acquiring time-series images makes it possible to observe the motion of the subject.

There are two types of images that are generated by an MRI apparatus: magnitude images and phase images. Phase images are used to image the flow velocity. For example, in phase contrast MR angiography, time-series magnitude images and time-series phase images are output.

When k-space data is acquired and MR images are reconstructed, noise may be caused. As a method of removing the noise components to improve the image quality, there is a method using a filter.

BRIEF DESCRIPTION OF THE DRAWINGS

FIG. 7 is a diagram representing an exemplary low-pass filter according to the first embodiment;

FIG. 8 is a diagram representing an exemplary filter according to a first modification of the first embodiment;

DETAILED DESCRIPTION

An image processing apparatus according to an embodiment includes conversion circuitry, magnitude image generating circuitry and phase image generating circuitry. The conversion circuitry is configured to convert time-series k-space data into first time-series x-space data, the x-space representing a spatial position. The magnitude image generating circuitry is configured to generate a magnitude image from second time-series x-space data, the second time-series x-space data being acquired by applying a first filter to the first time-series x-space data. The phase image generating circuitry is configured to generate a phase image from third time-series x-space data, the third time-series x-space data being acquired by applying, to the first time-series x-space data, a second filter that is different from the first filter. A magnetic resonance imaging apparatus according to an embodiment includes acquiring circuitry and the image processing apparatus. The acquiring circuitry is configured to acquire time-series k-space data. The image processing apparatus generates a magnitude image and a phase image, using the time-series k-space data.

With reference to the accompanying drawings, embodiments of an image processing apparatus and a magnetic resonance imaging apparatus (MRI apparatus) will be described in detail below. An MRI apparatus also serving as an image processing apparatus will be described as the embodiments. Embodiments are not limited to the following embodiments. For example, it is possible to apply the contents of each embodiment described below similarly to other embodiments in principle.

First Embodiment

Figure 1:
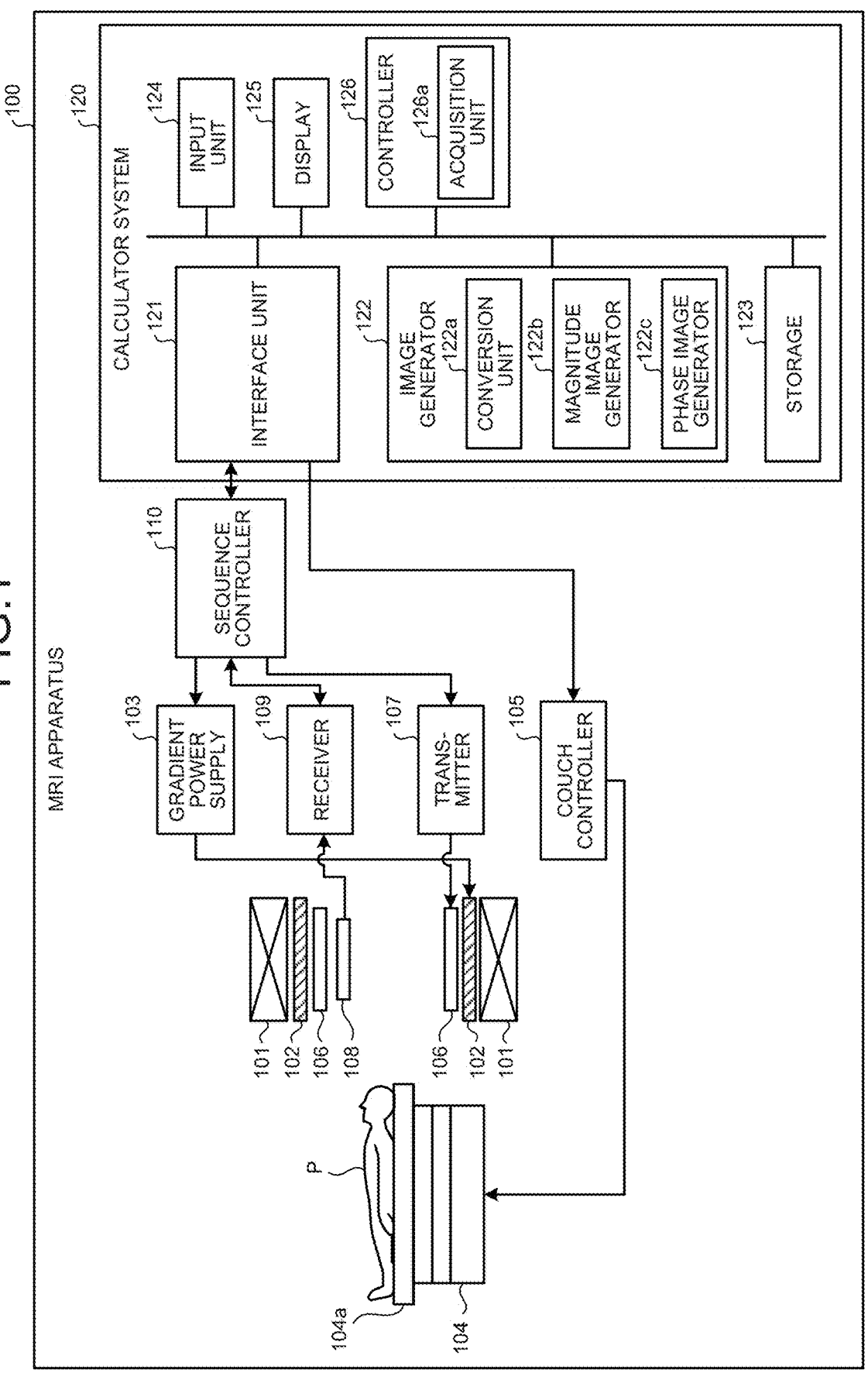
FIG. 1 is a block diagram representing a configuration of an MRI apparatus according to a first embodiment.

FIG. 1 is a block diagram representing a configuration of an MRI apparatus according to a first embodiment. As shown in FIG. 1, an MRI apparatus 100 includes a static magnetic field magnet 101; a gradient coil 102; a gradient power supply 103; a couch 104; a couch controller 105; a transmitting coil 106; a transmitter 107; a receiving coil 108; a receiver 109; a sequence controller 110; and a calculator system 120. The MRI apparatus 100 does not include a subject P (such as a human body). The configuration shown in FIG. 1 is an example only. For example, the units of the sequence controller 110 and the calculator system 120 may be configured integrally or independently.

The static magnetic field magnet 101 is a hollow magnet that is formed in an approximately cylindrical shape and that generates a uniform static magnetic field in the internal space. The static magnetic field magnet 101 is, for example, a superconducting magnet that is magnetically excited with a current supplied from a static magnetic field power supply (not shown). The static magnetic field magnet 101 may be a permanent magnet. In this case, the MRI apparatus 100 does not necessarily by itself comprise a static magnetic field power supply.

The gradient coil 102 is a hollow coil that is formed in an approximately cylindrical shape and is disposed at the inner side of the static magnetic field magnet 101. The gradient coil 102 is formed by combining three coils that are orthogonal to one another and that correspond respectively to X, Y, and Z axes. Upon independently receiving currents from the gradient power supply 103, these three coils generate gradient fields whose magnetic intensities vary along the X, Y, and Z axes. The Z-axis direction is the same as the direction of the static magnetic field.

The gradient power supply 103 supplies a current to the gradient coil 102. Each of the gradient fields on the X, Y and Z axes generated by the gradient coil 102 respectively corresponds to, for example, a slice selection gradient field Gs, a phase encoding gradient field Ge, and a read-out gradient field Gr. The slice selection gradient field Gs is used to arbitrarily determine an imaging cross-section. The phase encoding gradient field Ge is used to vary the phase of a magnetic resonance signal (hereinafter, referred to as a "MR signal" as appropriate) in accordance with the spatial position. The read-out gradient field Gr is used to vary the frequency of the MR signal in accordance with the spatial position.

The couch 104 includes a couchtop 104a on which the subject P is placed. Under the control of the couch controller 105, the couchtop 104a is inserted into the hollow (imaging port) of the gradient coil 102 in a state where the subject P is placed on the couchtop 104a. In general, the couch 104 is set such that its longitudinal direction is parallel to the center axis of the static magnetic field magnet 101. Under the control of the calculator system 120, the couch controller 105 drives the couch 104 to move the couchtop 104a in the longitudinal direction and the vertical direction.

The transmitting coil 106 is disposed at the inner side with respect to the gradient coil 102 and, upon receiving a radio frequency (RF) pulse supplied from the transmitter 107, generates a high-frequency magnetic field. The transmitter 107 supplies, to the transmitting coil 106, RF pulses corresponding to the Lamor frequency that is determined by the type of atomic nuclei to be dealt with and the magnitude of the magnetic field.

The receiving coil 108 is disposed at the inner side with respect to the gradient coil 102 and receives MR signals that are emitted from the subject P because of the effect of the high-frequency magnetic field. Upon receiving a MR signal, the receiving coil 108 outputs the received MR signal to the receiver 109. According to the first embodiment, the receiving coil 108 is a coil array having one or multiple, typically, multiple receiving coils. The transmitting coil 106 and the receiving coil 108 described above are examples only. They may be configured as one of, or a combination of, a coil having a transmitting function, a coil having a receiving function, and a coil having a transmitting and receiving function.

The receiver 109 generates MR data based on the MR signals that are output from the receiving coil 108. Specifically, the receiver 109 generates MR data by performing analog/digital conversion on the MR signals output from the receiving coil 108. The receiver 109 transmits the generated MR data to the sequence controller 110. The receiver 109 may be disposed on the side of the gantry including the static magnetic field magnet 101 and the gradient coil 102. According to the first embodiment, the MR signals that are output from each coil element of the receiving coil 108 are divided and combined properly to be output to the receiver 109 per unit called, for example, channel. Thus, the MR data is dealt with per channel, in or subsequent to, the processing by the receiver 109. Regarding the relation between the total number of coil elements and the total number of channels, they may be the same. Alternatively, the total number of channels may be smaller than the total number of coil elements. Still alternatively, the total number of channels may be larger than the total number of coil elements. When the expression "per channel" is used below, the processing may be performed per coil element or may be performed for each channel obtained by dividing and combining the coil elements. The timing of division and combination is not limited to the above-described timing. It is sufficient if the MR signals or MR data is divided and combined per channel before the processing performed by an image generator 122, as described below.

The sequence controller 110 images the subject P by driving the gradient power supply 103, the transmitter 107, and the receiver 109 in accordance with the sequence information transmitted from the calculator system 120. The sequence information is information that defines a procedure for imaging. The sequence information defines the magnitude of the power supplied from the gradient power supply 103 to the gradient coil 102, the timing at which the power is supplied, the magnitude of the RF pulse that is transmitted by the transmitter 107 to the transmitting coil 106, the timing at which the RF pulse is applied, and the timing at which the receiver 109 detects an MR signal. For example, the sequence controller 110 is an integrated circuit, such as an application specific integrated circuit (ASIC) or a field programmable gate array (FPGA), or an electronic circuit, such as a central processing unit (CPU) or a micro processing unit (MPU).

Upon receiving the MR data from the receiver 109 as a result of imaging the subject P by driving the gradient power supply 103, the transmitter 107, and the receiver 109, the sequence controller 110 transfers the received MR data to the calculator system 120.

The calculator system 120 controls the whole MRI apparatus 100, acquires data, and generates images, etc. The calculator system 120 includes an interface unit 121, the image generator 122, storage 123, an input unit 124, a display 125, and a controller 126. The controller 126 includes an acquisition unit 126a.

The interface unit 121 transmits the sequence information to the sequence controller 110 and receives the MR data from the sequence controller 110. Upon receiving the MR data, the interface unit 121 stores the received MR data in the storage 123. The MR data stored in the storage 123 is arranged in a k-space by the acquisition unit 126a of the controller 126. As a result, the storage 123 stores k-space data. For example, the storage 123 stores time-series k-space data of one or more channels.

The image generator 122 serves as an image processing apparatus that generates images by performing image processing using the data acquired by the acquisition unit 126a or the data stored in the storage 123. As shown in FIG. 1, the image generator 122 includes a conversion unit 122a, a magnitude image generator 122b, and a phase image generator 122c. The conversion unit 122a applies, for example, to the k-space data acquired by the acquisition unit 126a, the Fourier transform in the spatial direction, thereby acquiring post-transformation time-series space data. The magnitude image generator 122b generates a magnitude image (time-series spatial magnitude image) from the post-transformation time-series space data. The phase image generator 122c generates a phase image (time-series spatial phase image) from the post-transformation time-series space data. The image acquired by the image generator 122 is displayed by the display 125 or transmitted to and stored in the storage 123, as required. The phase image generator 122c calculates a temporal change in the flow velocity value from a specific area in the time-series spatial phase image and generates a curve representing the temporal changes in the flow velocity. The flow velocity value and curve acquired by the phase image generator 122c are displayed by the display 125 or transmitted to and stored in the storage 123 as required. The image processing performed by the image generator 122 will be described in detail below.

The storage 123 stores the MR data received by the interface unit 121, the k-space data acquired by the acquisition unit 126a, the image data generated by the image generator 122, etc. For example, the storage 123 is a semiconductor memory device such as a random access memory (RAM) or a flash memory, a hard disk, or an optical disc.

The input unit 124 receives inputs of various instructions and information from an operator. The input unit 124 is, for example, a pointing device, such as a mouse or a trackball, or an input device, such as a keyboard. The display 125 displays various types of information, such as image data, under the control of the controller 126. The display 125 is, for example, a display device, such as a liquid crystal display.

The controller 126 controls the whole MRI apparatus 100. Specifically, the controller 126 includes the acquisition unit 126a. The acquisition unit 126a generates sequence information in accordance with imaging conditions that are input by the user via the input unit 124 and transmits the generated sequence information to the sequence controller 110 to control the imaging. The acquisition unit 126a arranges the MR data in a k-space to acquire k-space data.

Specifically, the acquisition unit 126a acquires time-series k-space data on multiple channels while changing the sampling position in the spatial direction. The controller 126 controls image generation performed by the image generator 122 by using the MR data that is transmitted from the sequence controller 110 as the result of the imaging, and controls display by the display 125. The controller 126 is, for example, an integrated circuit, such as an application specific integrated circuit (ASIC) or a field programmable gate array (FPGA), or is electronic circuitry, such as a central processing unit (CPU) or a micro processing unit (MPU).

The overall configuration of the MRI apparatus 100 according to the first embodiment has been described. In the configuration, the image generator 122 serving as an image processing apparatus acquires the time-series k-space data acquired by the acquisition unit 126a and generates magnitude images and phase images. Before explaining about the image generator 122 according to the first embodiment, let us briefly comment on the terminology used for the following embodiment.

In the following embodiment, an "x-space" means a space of "x" denoting a spatial position. The x-space is a hydrogen distribution image space in its wider context, including cases where imaging other than hydrogen atoms as a target, for the sake of convenience of explanation. An "x-space data" means a set of signal points in the x space. Different signal points in the x-space are associated with signal points at different positions in the x-space. For example, a three-dimensional cerebral hydrogen distribution image is three-dimensional x-space data and a two-dimensional x-space image of a cross-section of the heart is two-dimensional x-space data.

Furthermore, "k-t space data" is time-series k-space data. By converting k-t space data in which converting k-space data into x-space data, such as Fourier transform, it is possible to acquire time-series x-space data (x-t space data).

Furthermore, "t-f conversion" means converting data on a t-axis that is the time axis into data on an f-axis that is different from the t-axis. For example, the Fourier transform is used as a specific example of the t-f conversion. Other exemplary t-f conversions include, for example, expanding the data by normalized orthogonal functions different from the case of the Fourier transform, by spherical harmonics or by spherical Bessel functions. Note that "f" is named after the frequency and denotes, in the case of the Fourier transform, a quantity associated with the frequency of a corresponding sinusoidal function.

When the time-series x-space data (x-t space data) is converted on the time axis by the t-f conversion, x-f space data is acquired. When the Fourier transform is employed for the t-f conversion, x-f space data becomes what the x-t space data is expressed as coefficient values after the Fourier transform. The position of each signal point in the x-f space data is determined when position in the x-axis and position in the f-axis are known. The embodiment will be described below, using a case where the Fourier transform is employed as an example of the t-f conversion.

Next, the magnitude image and the phase image will be briefly described. The MR signal, being a complex number, has an absolute value of the complex number and an argument on the complex plane. The former value is referred to as the magnitude (amplitude) and the latter is referred to as the phase. An image for which the magnitude of the MR signal is calculated for each position in the x-space is a magnitude image, and an image for which the phase of the MR signal is calculated for each position in the x-space is a phase image.

The procedure for calculating the flow velocity from the phase image will be described briefly. There is a method called phase contrast method as a method of calculating a flow velocity from a phase image.

Figure 2A:
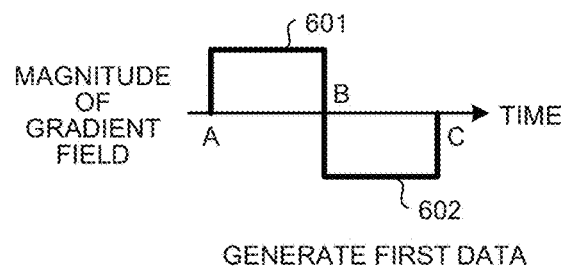
FIG. 2A, FIG. 2B and FIG. 2C are diagrams for explaining the overview of a phase contrast method.
Figure 2B:
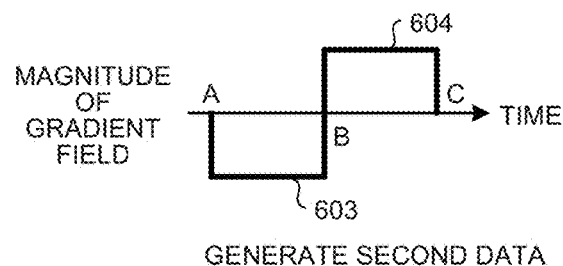
Figure 2C:
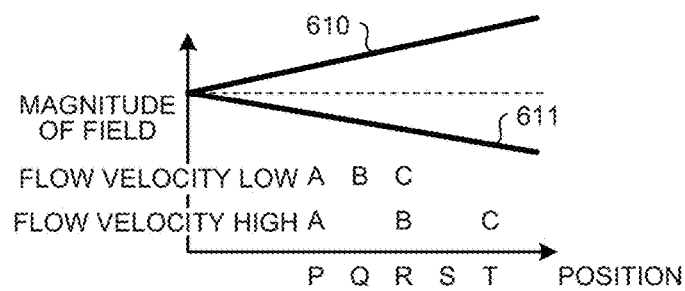

FIG. 2A, FIG. 2B and FIG. 2C are diagrams briefly illustrating the procedure for calculating a flow velocity by using a phase contrast method. In the phase contrast method, application of a bipolar gradient field is an essential idea. A bipolar gradient field is a magnetic field (gradient field) whose magnitude spatially varies, and the polarity with which the bipolar gradient field is applied is inverted to the positive or negative polarity depending on the time. Typically, a bipolar magnetic field whose duration in the positive polarity equals that in the negative polarity and whose absolute value of the magnetic field magnitudes are identical to each other in the positive and the negative polarity is employed.

FIG. 2A is a diagram representing a specific example of a "first bipolar gradient field" that is applied based on the phase contrast method. In this example, as Curve 601 shows, a gradient field is applied with the positive polarity from Time A to Time B. Furthermore, as Curve 602 shows, a gradient field is applied with the negative polarity from Time B to Time C.

As the applied magnetic fields are gradient fields, the magnitude of the magnetic fields differ spatially. FIG. 2C schematically illustrates this situation. The horizontal axis represents the spatial position and the vertical axis represents the total magnitude of the magnetic field at that position. For example, as Curve 610 shows, when a positive gradient field is applied, the magnitude of the magnetic field increases as the position changes as "P", "Q", "R", "S" and "T". On the contrary, as Curve 611 shows, when a negative gradient field is applied, the magnitude of the magnetic field decreases as the position changes as "P", "Q", "R", "S" and "T". For example, the magnetic field shown by Curve 610 is applied from Time A to Time B shown in FIG. 2A, and the gradient field shown by Curve 611 is applied from Time B to Time C shown in FIG. 2A.

An MR signal acquired when a bipolar gradient field is applied to a static fluid will be described here. The phase $\theta(x)$ of the MR signal at a spatial position x is represented by the following equation: $\theta(x)=\int \gamma B(x)dt$, where $B(x)$ is a local magnetic field at the point x, $\gamma$ is a constant, and t is a time. Accordingly, the phase $\theta(x)$ of the MR signal is proportional to the local magnetic field $B(x)$.

Next, phase changes of the static fluid at a position P shown in FIG. 2C is discussed. The positive magnetic field is applied to the static fluid at Position P between Time A and Time B as shown by Curve 610, and (when a uniform magnetic field is the reference) the negative magnetic field is applied to the fluid from Time B to Time C as shown by Curve 611; however, integration of the magnitude of the magnetic field from Time A to Time C gives zero. Thus, there is no phase change of the static fluid at Position P.

Next, the phase change of the moving fluid is discussed. First, the "low flow velocity" situation shown in FIG. 2C is considered. The fluid is at Position P at Time A, moves to Position Q at Time B, and moves to Position R at Time C. The positive magnetic field is applied from time A to Time B as illustrated in Curve 610, and the negative magnetic field is applied from time B to Time C as illustrated in Curve 611. The magnitude of the gradient field increases as being away from the position P. Accordingly, for the fluid, the effect of the magnetic field applied from Time B to Time C on the fluid is larger than the effect of the magnetic field applied from Time A to Time B; therefore, the phase changes do not cancel out to zero and finite phase changes remain.

Next, the "high flow velocity" situation as illustrated in FIG. 2C is discussed. The fluid is at Position P at Time A, is at the position R at Time B, and is at the position T at Time C. As the fluid moves to the further, the difference in the gradient field increases in the meantime. Thus, the difference between the effect of the magnetic field applied from Time A to Time B and the effect of the magnetic field applied from Time B to Time C is larger compared to that in the "low flow velocity" situation. Accordingly, the phase changes in the "high flow velocity" situation are larger than that in the "low flow velocity" situation.

In other words, when the position of the fluid in the bipolar gradient field moves, the phase changes in the MR signal corresponding to the moving velocity of the fluid are observed.

Practically, for example, first data may be created by applying a first bipolar gradient field as shown in FIG. 2A, second data may be created by applying a second bipolar gradient field with a polarity inverted compared to the polarity of the first bipolar gradient field as shown in FIG. 2B, and difference data between the first data and the second data may be created. As the difference data has a data value of 0 when the flow velocity is 0 and the data value increases as the flow velocity increases, it is possible to calculate the flow velocity from the differential data of the phase image. The phase contrast method also enables generation of a magnitude image from "first bipolar gradient field" and the time-series k-space data that is acquired during application the first bipolar gradient field.

For example, the aorta (heart) is an exemplary site to which the phase contrast method can be applied. It is also possible to apply the phase contrast to other sites. For example, it is possible to apply the phase contrast method to the pulmonary artery (lung), the carotid (cervix), etc.

In a case where both time-series magnitude images and time-series phase images are generated by using the phase contrast method, however, when a strong low-pass filter being to the extent that temporally changing noise in magnitude images is eliminated, it is not possible to calculate the flow velocity correctly. On the contrary, if the low-pass filter is too weak, temporally changing noise in magnitude images cannot be eliminated.

Thus, according to the first embodiment, in order to correctly acquire the flow velocity and at the same time improve the image quality of the magnitude image, the image generator 122 performs the following processing. The conversion unit 122a converts time-series k-space data into first time-series x-space data. The x-space represents a spatial position. The magnitude image generator 122b generates a magnitude image from second time-series x-space data. The second time-series x-space data is acquired by applying a first filter to the first time-series x-space data. The phase image generator 122c then generates a phase image from third time-series x-space data. The third time-series x-space data is acquired by applying, to the first time-series x-space data, a second filter. The second filter is different from the first filter.

According to the first embodiment, the first filter and the second filter are operating on an f-axis that is different from a t-axis representing a time axis. The magnitude image generator 122b acquires x-f space data by performing t-f conversion to the first time-series x-space data output by the conversion unit 122a, and applies, after applying the first filter on the x-f space data, inverse transformation of the t-f conversion, thereby acquiring the second time-series x-space data. The phase image generator 122c performs the t-f conversion to the first time-series x-space data, thereby acquiring the x-f space data. The phase image generator 122c further applies, after applying the second filter on the x-f space data, the inverse transformation of the t-f conversion, thereby generating the third time-series x-space data.

Each of the first filter and the second filter is set according to the type of the output image. For example, the magnitude image generator 122b acquires a time-series spatial magnitude image by applying the first filter whose filter passage range is restricted to a first range including direct current components of frequency components of temporal changes. Furthermore, for example, the phase image generator 122c applies, to a first time-series x-space data that is a post-conversion time-series space data, a first filter whose filter passage range is restricted to a first range inclusive of direct current component in the frequency component of the temporal changes, thereby acquiring a time-series spatial magnitude image. Furthermore, the phase image generator 122c applies, to a first time-series x-space data that is a post-conversion time-series space data, a second filter whose filter passage range is restricted to a second range including higher frequency component than the first range inclusive of the direct current component in the frequency component of the temporal change, thereby acquiring a time-series spatial phase image.

An outline of the processing performed by the image generator 122 according to the first embodiment will be described briefly below with reference to FIGS. 3 and 4. An example where, after the Fourier transform is used for the "t-f conversion", low-pass filters are used as the first filter and the second filter will be described below; however, embodiments are not limited to this as described below.

Figure 3:
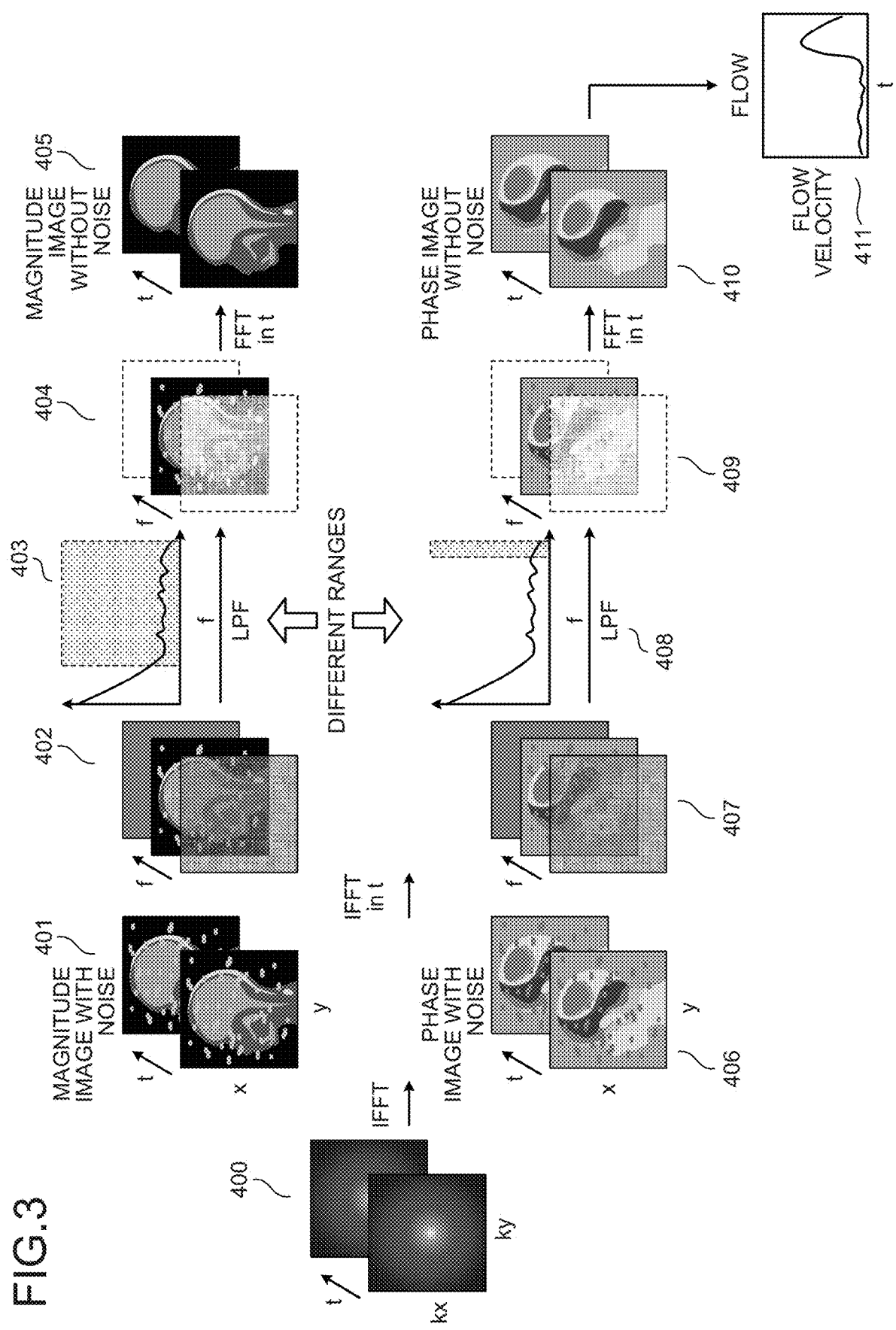
FIG. 3 is a diagram for explaining the overview of image generation according to the first embodiment.
Figure 4:
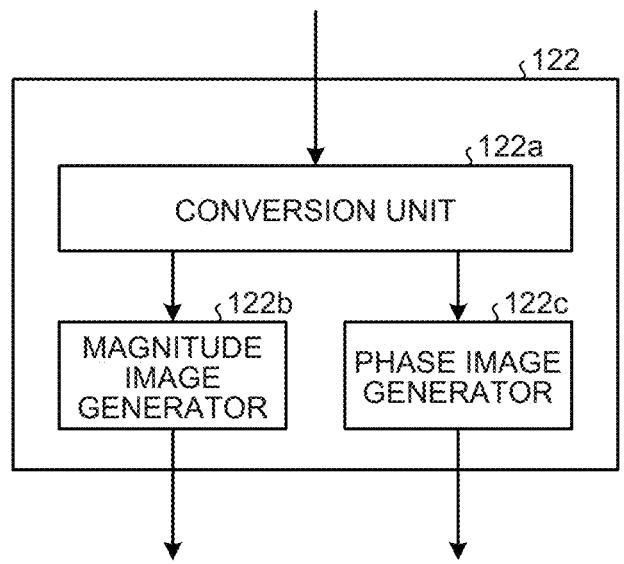
FIG. 4 is a diagram for explaining a flow of processing performed by an image generator according to the first embodiment.

FIG. 3 is a diagram for explaining an outline of the image generation according to the first embodiment, and FIG. 4 is a diagram for explaining a flow of processing performed by the image generator 122 according to the first embodiment. FIG. 4 is a diagram in which, in accordance with the data input/output mode, the arrangement of the conversion unit 122a, the magnitude image generator 122b, and the phase image generator 122 is changed.

The acquisition unit 126a acquires the MR data from the sequence controller 110 and acquires time-series k-space data 400. The conversion unit 122a acquires the time-series k-space data 400 from the acquisition unit 126a. As shown in FIG. 3, the conversion unit 122a applies the inverse fast Fourier transform (IFFT) in the k-direction to the time-series k-space data 400 to acquire first time-series x-space data (first x-t space data). The first x-t space data has a complex value. Accordingly, on the basis of the time-series data, it is possible to generate a magnitude image 401 and a phase image 406.

As shown in FIG. 3, as the magnitude image 401 and the phase image 406 generated from the first x-t space data contain noise, it is necessary to eliminate the noise. Based on the first time-series x-space data (first x-t space data) converted by the conversion unit 122a, the magnitude image generator 122b performs filter processing using the first filter, thereby generating a magnitude image from which the noise has been eliminated. Based on the first time-series x-space data (first x-t space data) converted by the conversion unit 122a, the phase image generator 122c performs filter processing using the second filter different from the first filter, thereby generating a phase image from which the noise has been eliminated.

First, the magnitude image generator 122b and the phase image generator 122c performs t-f conversion (inverse Fast Fourier transform: IFFT) with respect to t, to the first time-series x-space data (first x-t space data), thereby acquiring first x-f space data. By calculating magnitude components and phase components on the basis of the first x-f space data, the image generator 122 can generate a magnitude image 402 and a phase image 407. Note that, as shown in FIG. 3, the magnitude image 402 and the phase image 407 that are generated from the first x-f space data also contain noise.

The magnitude image generator 122b applies the first filter on the f-axis to the first x-f space data. The phase image generator 122c applies, to the first x-f space data, on the f-axis, a second filter different from the first filter. The first filter and the second filter are filters on the f-axis different from the t-axis that is the time direction.

As the flow velocity changes from time to time, various frequency modes complicatedly contribute to the phase image. Accordingly, when a too strong filter is applied, it is not possible to calculate the flow velocity accurately. On the other hand, as far as the magnitude image is concerned, it is often the case that acquiring only the static information (direct current component) and information in the vicinity of a certain frequency corresponding to the cardiac cycle or the respiratory cycle is sufficient. Thus, it is possible to acquire data of good signal-to-noise ratio, by applying a strong filter.

As described, since the "strength" of filters is different between magnitude images and phase images, it is not possible to obtain an accurate result by using the same filter for a magnitude image and a phase image. For this reason, the image generator 122 serving as the image processing apparatus according to the embodiment employs different filters for a magnitude images and a phase image. Particularly, since it is necessary to accurately calculate the frequency dependence of the phase image in order to calculate temporal changes in the flow velocity, for example, the second filter used to generate a phase image can be a weaker filter than the first filter used to generate a magnitude image.

For example, the first filter is a stronger data smoothing filter than the second filter is. In other words, as an example of the first filter, for example, a low-pass filter, like a low-pass filter 403 shown in FIG. 3, that filters out most of the region of f except for a small region of f is preferable. For an example of the second filter, for example, a low-pass filter, like a low-pass filter 408 shown in FIG. 3, that filters out only a high-frequency region of f, leaving most of the region of f as it is, is preferable.

The magnitude image generator 122b generates x-f space data for magnitude image by applying, for example, the low-pass filter 403 to the first x-f space data. As the x-f space data for magnitude image is of a complex number, it is possible to generate a magnitude image 404 by calculating the magnitude components. The phase image generator 122c can generate x-f space data for phase image by applying, for example, the low-pass filter 408 to the first x-f space data. As the x-f space data for phase image is of a complex number, it is possible to generate a phase image 409 by calculating the phase components.

The magnitude image generator 122b acquires the second x-t space data from which the noise has been eliminated, by applying inverse transformation of the above-described t-f conversion to the x-f space data for magnitude image in the f direction. As shown in FIG. 3, the magnitude image generator 122b generates a magnitude image 405 from which the noise has been eliminated, by calculating magnitude components of the second x-t space data.

The phase image generator 122c can acquire third x-t space data from which the noise has been eliminated, by applying inverse transformation (Fourier transform) of the above-described t-f conversion in the f direction to the phase image x-f space data. The phase image generator 122c calculates a phase component of the third x-t space data, thereby generating a phase image 410 from which the noise has been eliminated. Furthermore, since the phase image 410 and the flow of flow velocity are correlated in the phase contrast method, the phase image generator 122c calculates a flow velocity curve 411 serving as a function of the time t by using the phase image 410 from which the noise has been eliminated, as shown in FIG. 3.

FIG. 3 shows the magnitude image 401 and the phase image 406 generated from the first x-t space data, the magnitude image 402 and the phase image 407 generated from the first x-f space data, the magnitude image 404 generated from the second x-f space data, and the phase image 409 generated from the third x-f space data. Practically, these images are not necessarily generated. According to the embodiment, for example, the magnitude image 401 and the phase image 406 may be displayed together with the magnitude image 405 and the phase image 410, thereby allowing an operator to see whether the noise is removed from the first and second filters. Similarly, according to the embodiment, for example, the flow velocity curve calculated by using the phase image 406 may be displayed together with the flow velocity curve 411, thereby allowing an operator to see whether the noise is removed from the first and second filters.

Figure 5:
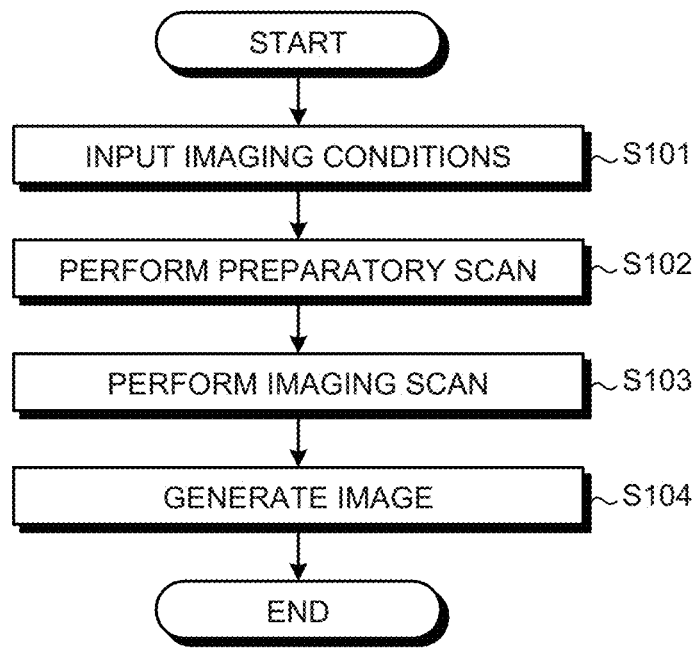
FIG. 5 is a flowchart of a procedure of processing performed by the MRI apparatus according to the first embodiment.

With reference to FIG. 5, the processing performed by the MRI apparatus 100 according to the first embodiment will be described. FIG. 5 is a flowchart of the procedure of processing performed by the MRI apparatus according to the first embodiment.

As shown in FIG. 5, first, the controller 126 receives an input of imaging conditions from an operator (step S101). The acquisition unit 126a controls execution of preparatory scanning by generating sequence information based on the imaging conditions input from the operator and transmitting the generated sequence information to the sequence controller 110 (step S102). The preparatory scanning includes, for example, a scan for acquiring a localizer image, a shimming scan for correcting non-uniformity of the static magnetic field, and a scan for acquiring sensitivity distribution information.

After the preparatory scanning ends, the acquisition unit 126a controls an execution of imaging scans for acquiring output images (image to be output for a diagnosis) by generating sequence information based on the imaging conditions that are input from the operator and transmitting the generated sequence information to the sequence controller 110. (step S103). In the first embodiment, the acquisition unit 126a acquires time-series k-space data of one or more channels in the imaging scans. For example, according to the first embodiment, the acquisition unit 126a acquires the time-series k-space data by performing full-sampling without decimating data.

The image generator 122 generates an image by using the time-series k-space data of one or multiple channels that is acquired at step S103 and stored in the storage 123 (step S104). The generated image is stored in the storage 123 or displayed on the display 125 as required.

Figure 6:
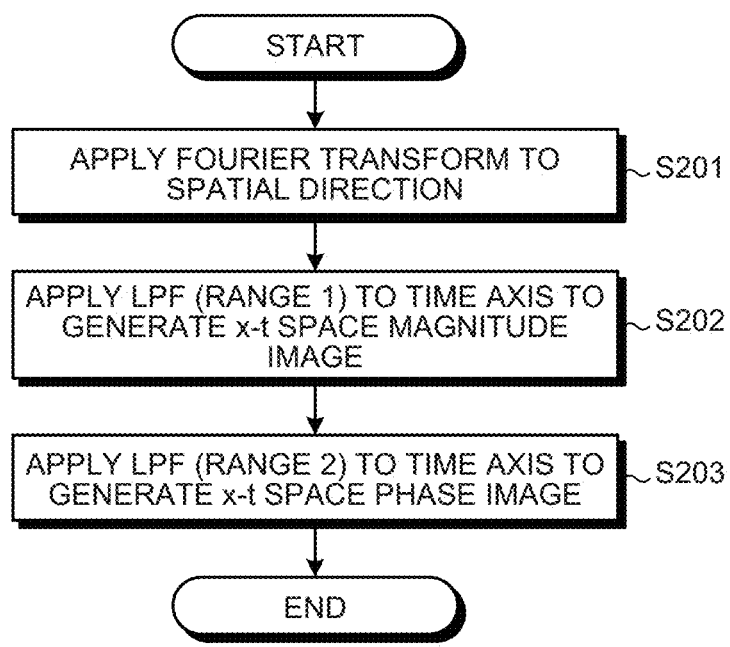
FIG. 6 is a flowchart of an exemplary procedure of processing performed by the image generator according to the first embodiment.

Next, exemplary processing performed by the image generator 122 according to the first embodiment at step S104 shown in FIG. 5 is described. FIG. 6 is a flowchart of an exemplary procedure of processing performed by the image generator according to the first embodiment.

As shown in FIG. 6, first, the conversion unit 122a acquires x-t space data of each channel by reading time-series k-space data of one or multiple channels from the storage 123 and applying the Fourier transform, for example, to the time-series k-space data of each channel in the spatial direction (step S201). The conversion unit 122a passes the acquired x-t space data of each channel to the magnitude image generator 122b and the phase image generator 122c.

Specifically, the time-series k-space data of one or multiple channels that the conversion unit 122a reads from the storage 123 is time-series data in which the read out (RO) direction in the k-space, the phase encoding (PE) direction in the k-space, and the time serve as axes, and sets of time-series data corresponding to the number of channels are prepared. The conversion unit 122a applies the Fourier transform to the time-series data in the two axes of the RO direction in the k-space and the PE direction in the k-space, thereby outputting multi-dimensional data in which the x-direction in a hydrogen distribution image, the y-direction of the hydrogen distribution image, and the time serve as axes.

The magnitude image generator 122b generates an x-t space magnitude image by applying, for example, a low-pass filter on the time direction to the x-t space data of each channel acquired at step S201 (step S202). Specifically, the magnitude image generator 122b acquires x-f space data of each channel by applying the Fourier transform to the time direction in the x-t space data (first x-t space data) of each channel acquired at step S201. The magnitude image generator 122b applies a low-pass filter with Range 1 to the f-axis to replace the signal values at signal points out of Range 1 with "zero (0)". The magnitude image generator 122b applies the inverse Fourier transform to the x-f space data, on which the low-pass filter has been applied, to acquire x-t space data (second x-t space data). The magnitude of each set of x-t space data is set as a signal value of each x-t space magnitude image to acquire an x-t space magnitude image.

After step S202, or in parallel with step S202, the phase image generator 122c generates an x-t space phase image by applying, for example, a low-pass filter on the time direction to the x-t space data of each channel acquired at step S201 (step S203). Specifically, the phase image generator 122c obtains x-f space data of each channel by applying the Fourier transform in the time direction to the x-t space data (first x-t space data) of each channel acquired at step S201.

The phase image generator 122c then applies a low-pass filter with Range 2 that is a larger range than Range 1 on the f-axis, thereby replacing the signal values at signal points other than Range 2 with "zero (0)". By applying the inverse Fourier transform to the x-f space data after the low-pass filter has been applied, x-t space data (third x-t space data) is obtained. The phase of each set of x-t space data is set as a signal value of each x-t space phase image, thereby acquiring an x-t space phase image.

The relationship between Range 1 and Range 2 described above is shown by the low-pass filter 403 and the low-pass filter 408 shown in FIG. 3. It is explained here again with reference to FIG. 7. FIG. 7 is a diagram representing an exemplary low-pass filter according to the first embodiment. The x-t space magnitude image is an image acquired for the purpose of observing the motion of the subject P and is acquired when, for example, observing periodic pulsations of the heart. For this reason, Range 1 needs to be set in a range inclusive of a direct current component and a frequency corresponding to the motion of the subject P as illustrated in FIG. 7. On the other hand, the x-t space phase image is an image acquired for the purpose of observing the flow velocity of, for example, the blood flow. For example, the x-t space phase image may be used to calculate temporal changes of the flow velocity value from the temporal changes of the signal in a specific area of the image, such as the origin of the aorta. As the flow velocity value contains the high-frequency components, Range 2 needs to be set in a range that does not affect the flow velocity value. For this reason, as shown in FIG. 7, Range 2 is set such that Range 1<Range 2.

According to the embodiment, Range 1 and Range 2 may be changed from one subject to another within a range where Range 1<Range 2, which will be described in detail below. For Range 2, the whole frequency band may be set. This case is equivalent to the case where no low-pass filter is applied at step S203.

In the embodiment, the case has been described where the low-pass filters in which the cut-off frequencies are set are used, such as the above-described Range 1 and Range 2. However, according to the embodiment, the band-pass filters in which partial ranges are specified may be set for the first filter and the second filter. Also in that case, Range 2 needs to cover higher frequency components than the Range 1.

As described above, according to the first embodiment, in accordance with the type of output image, Range 2 is set to be larger than Range 1, the Range 2 being a range applied to a second filter that is for generating a phase image, the Range 1 being a range applied to a first filter that is for generating a magnitude image. Thereafter, the first filter and the second filter are applied to the x-t space data, thereby generating the magnitude image and the phase image. Consequently, according to the first embodiment, it is possible to obtain correct flow velocity data and thus improve the image quality of the magnitude image.

In the first embodiment, the following case has been explained. That is, the conversion unit 122a applies a Fourier transform to the time-series k-space data in the spatial direction, thereby acquiring x-t space data for each channel. The magnitude image generating unit 122b and the phase image generating unit 122c apply Fourier transform to the x-t space data for each channel on the time axis, thereby acquiring x-f space data for each channel. Each of the magnitude image generating unit 122b and the phase image generating unit 122c applies different filters to x-f space data for each channel. Each of the magnitude image generating unit 122b and the phase image generating unit 122c applies inverse Fourier transform to each of the x-f space data on which each of the filters has been applied, thereby generating magnitude image or phase image that is x-t space data.

However, embodiments are not limited to this. For example, the following embodiments are possible.

For example, the conversion unit 122a takes over a portion of the role the magnitude image generating unit 122b and the phase image generating unit 122c had played. Specifically, conversion unit 122a applies Fourier transform to time-series k-space data in each of k-space axes and on a time axis, thereby acquiring frequency-space data (x-f space data). Furthermore, a filtering unit (not shown) takes over a portion of the role the magnitude image generating unit 122b and the phase image generating unit 122c had played. In this case, the filtering unit applies a filter of a first frequency band to the frequency-space data, thereby acquiring first frequency-space data and applies a filter of a second frequency band to the frequency-space data, thereby acquiring second frequency-space data, the second frequency band being different from the first frequency band. At this moment, the filter of the first frequency band filters out a broader band than the filter of the second frequency band. Furthermore, the magnitude image generating unit 122b generates a magnitude image using the first frequency-space data, for example, by applying inverse Fourier transform. The phase image generating unit 122c generates a phase image using the second frequency-space data, for example, by applying inverse Fourier transform.

Furthermore, as for the time-series k-space data, time-series k-space data acquired in a parallel imaging may be employed. In other words, the time-series k-space data may be k-space data acquired, being decimated at least in one of phase encode directions or on time-axis.

First Modification of First Embodiment

For the first embodiment described above, the exemplary case has been described where the image generator 122 applies the filter processing using the Fourier transformation and the low-pass filters. In other words, according to the first embodiment, the image generator 122 acquires the first x-f space data by applying the Fourier transform on the first x-t space data (the first time-series x-space data) acquired by converting the k-t space data. The image generator 122 then acquires the x-f space data for magnitude image by applying the low-pass filter for magnitude images to the first x-f space data and acquires the x-f space data for phase image by applying the low-pass filter for phase images to the first x-f space data. The image generator 122 then acquires second x-t space data (second time-series x space data) by applying the (inverse) Fourier transform to x-f space data for magnitude image and acquires third x-t space data (third time-series x-space data) by applying the (inverse) Fourier transform to x-f space data for phase image. The image generator 122 generates time-series magnitude images in which noise is eliminated from the second x-t space data and generates time-series phase images in which noise is eliminated from the third x-t space data. However, the first embodiment is not limited to this. For example, for each of the first and second filters used by the image generator 122, filters (spatial data smoothing filters) that perform smoothing on the time axis may be employed.

Specifically, according to a first modification of the first embodiment, the magnitude image generator 122b applies the first filter on the first time-series x-space data on the time axis, thereby acquiring the second time-series x-space data. The phase image generator 122c applies the second filter on the first time-series x-space data on the time axis, thereby acquiring the third time-series x-space data.

In the first modification of the first embodiment, at steps S202 and S203, no conversion to the x-f space data is made. Instead, two types of spatial data smoothing filters are applied in the temporal direction to the first x-t space data, thereby directly generating x-t space data after noise removal (second x-t space data and third x-t space data).

As an exemplary spatial data smoothing filter that is used in the first modification of the first embodiment, there is, for example, a data smoothing filter using a moving-average method. FIG. 8 is a diagram representing an exemplary spatial low-pass filter according to the first modification of the first embodiment. FIG. 8 illustrates an exemplary data smoothing filter using the moving-average method. The diagram on the left in FIG. 8 illustrates an exemplary data smoothing filter that calculates a moving average based on the values of the nine squares around all directions in a two-dimensional space. Each of the squares represents a data point and the number in each square represents the weight applied to the data point. For example, with the filter on the left in FIG. 8, the value of the data point at a set of x and y coordinates (x,y) after the smoothing is obtained by performing smoothing based on the nine data points at the sets of coordinates of (x−1,y−1), (x−1,y), (x−1,y+1), (x,y−1), (x,y), (x,y+1), (x+1,y−1), (x,y), and (x,y+1). Specifically, the value obtained by multiplying the value of each of the nine data points by their weights of "1/9" and summing the values of the nine points is the value at (x,y) after the smoothing.

The diagram on the right in FIG. 8 shows a filter that performs smoothing over the neighboring 25 points in the similar manner. With the filter on the left in FIG. 8, the value of the data point at (x,y) after the smoothing is obtained by performing smoothing based on the data point at (x,y) and the 24 data points around the data point at (x,y). Specifically, the value obtained by multiplying the value of each of the 25 data points by their weights of "1/25" and summing the values of the 25 points is the value at (x,y) after the smoothing. The difference between the filter on the left and the filter on the right in FIG. 8 will be considered. Consider a case where the current point to be smoothed is (x,y) and the values of other data points are all "0". In such a case, the value of the point (x,y) after the smoothing is 1/9 of the original data after the application of the filter on the left, and is 1/25 of the original data after the application of the filter on the right. Since the data points become more crumbled in the right filter than in the left filter, the right filter is a stronger data smoothing filter than the left filter is.

Furthermore, since this filter is practically applied to the time direction (i.e. one dimension), the weights of the filter shown in the left diagram in FIG. 8 are, for example, "1/3, 1/3, and 1/3" and the weights of the filter shown in the right diagram in FIG. 8 are, for example, "1/5, 1/5, 1/5, 1/5, 1/5 and 1/5.

For example, according to the first modification of the first embodiment, the right filter in FIG. 8 that is a strong data smoothing filter is employed for generating magnitude image, and the left filter in FIG. 8 that is a weak data smoothing filter is employed for generating phase image, thereby obtaining correct flow velocity data and improving the image quality of the magnitude image. Note that, according to the first modification of the first embodiment, a data smoothing filter in which the weights become larger as they approach closer to the pixel being smoothed, such as a Gaussian filter, may be applied.

For spike noise (noise whose value heavily protruding from neighboring values), application of a non-linear filter is more advantageous than a moving-average filter, a Gaussian filter, or a low-pass filter. In such a case, for example, a non-linear filter, such as a median filter may be applied.

As described above, according to the first modification of the first embodiment, by directly applying the filter to the time-series x-space data in the time direction, it is possible to obtain the correct flow velocity data and improve the image quality of a magnitude image. Furthermore, according to the first modification of the first embodiment, for example, by using a non-linear filter, it is possible to effectively eliminate a certain types of noise in which low-pass filters are not good at, such as white noise having a constant magnitude regardless of the frequency and spike noise that has a singular value in the x-space. According to the first modification of the first embodiment, a time-series phase images may be generated from first x-t space data without applying a data smoothing filter to the first x-t space data for generating phase images.

Second Modification of First Embodiment

For the above-described embodiment, the case has been described where the processing is performed on the basis of the time-series k-space data that is acquired by performing full-sampling without decimating data; however, the first embodiment is not limited to this. In other words, even when the sequence controller 110 performs the processing on the basis of time-series k-space data sample by decimating data, the image generator 122 makes it possible to obtain correct flow velocity data and thus improve the image quality of a magnitude image.

The case where sampling is performed by decimating data may be a case where data is acquired by decimating data by using multiple coils, which can be seen in, for example, parallel imaging, or may be a case where data is acquired by decimating data by using a single coil.

There are roughly two methods to deal with decimated data. In a first method, based on the decimated data, time-series x-space data is generated according to a reconstruction method for a magnitude image and a phase image, the image processing method described in the first embodiment is applied to the x-space data, and different filters are applied for a magnitude image and a phase image. In a second method, during processing for reconstructing the decimated data, different sets of reconstruction processing are used for a magnitude image and a phase image. In this case, specifically, reconstruction is performed at different reconstruction ranges between the magnitude image and the phase image. For the second modification, the former method will be described, and the latter method will be described in detail for a second embodiment.

Specifically, according to the second modification of the first embodiment, time-series k-space data (k-t space data) that is acquired by the acquisition unit 126a serves as time-series k-space data at first intervals in the k-space. According to the second modification of the first embodiment, the conversion unit 122a generates fourth time-series x-space data by applying the Fourier transform on k-space data at the first intervals in the k-space. The conversion unit 122a then generates fifth time-series x-space data corresponding to time-series k-space data that is acquired at second intervals each smaller than the first interval, by reconstructing the fourth time-series x-space data by using a given method. In other words, the fifth time-series x-space data is reconstructed from the fourth time-series x-space data by performing unfolding processing. The conversion unit 122a acquires the fifth time-series x-space data as first time-series x-space data and outputs the fifth time-series x-space data to the magnitude image generator 122b and the phase image generator 122c. The magnitude image generator 122b generates a magnitude image by performing, on the first time-series x-space data, the filter processing that is described in the first embodiment or in the first modification of the first embodiment. The phase image generator 122c generates a phase image by performing, on the first time-series x-space data, the filter processing that is described for the first embodiment or for the first modification of the first embodiment.

The time-series k-space data (k-t space data) used in the second modification of the first embodiment is k-space data that is acquired by decimating data in accordance with a "reduction factor R". In other words, the number of sets of time-series k-space data used in the second modification of the first embodiment is 1/R compared to the full-sampling.

The conversion unit 122a acquires x-t space data (fourth time-series x-space data) of each channel by applying the Fourier transform in the spatial direction to the k-t space data of each channel. The acquired x-t space data (fourth time-series x-space data) is folded data. Thus, unfolding processing by sensitivity encoding (SENSE), which is a parallel imaging method, is employed as the given reconstructing method, thereby reconstructing unfolded x-t space data (fifth time-series x-space data). After that, the fifth time-series x-space data is acquired as the first time-series x-space data. For example, in SENSE, on the basis of the sensitivity distribution information per channel that is acquired by, for example, preparatory scanning and the folded data, unfolded data is estimated. The estimation is based on a fact that "the folded data should be an image that is obtained by applying, to unfolded data, a product-sum operation of channel sensitivity distribution information and folded image of each channel". The unfolding processing used as the given reconstruction method may be an unfolding method other than SENSE. Alternatively, instead of the unfolding method for parallel imaging, for example, a reconstruction method using one channel, or a method of a combination of this method and parallel imaging, may be used.

According to the second modification of the first embodiment, the first time-series x-space data may be acquired by performing the processing described below on the time-series k-space data acquired at the first intervals in the k-space. For example, according to the second modification of the first embodiment, folded x-f space data is generated from k-t space data that is acquired by decimating data and reconstruction is performed by applying unfolding processing, such as k-t sensitivity encoding (k-t SENSE) that is a method extended from SENSE, to the folded x-f space data. In k-t SENSE, unfolding processing using SENSE is performed in a space obtained by applying the Fourier transform in the time axis to the time-series k-space data.

In this case, according to the second modification of the first embodiment, the conversion unit 122a generates first x-f space data by applying the Fourier transform on the time-series k-space data at the first intervals in the k-space and applying the above-described "t-f conversion" to the time-series k-space data. By reconstructing the first x-f space data by using a given method, the conversion unit 122a generates second time-series x-f space data corresponding to the time-series k-space data acquired in the k-space data at second intervals each narrower than the first interval. The conversion unit 122a acquires first time-series x-space data by applying inverse transformation of the t-f conversion to the second x-f space data, and outputs the first time-series x-space data to the magnitude image generator 122b and the phase image generator 122c.

In other words, the conversion unit 122a acquires the x-f space data (first x-f space data) of each channel by applying the Fourier transform to the spatial direction and applying the Fourier transform to the time axis in the k-t space data of each channel. From the first x-f space data, the conversion unit 122a reconstructs x-f space data (second x-f space data) unfolded by using unfolding processing, such as k-t SENSE as the given reconstruction method, and applies the inverse Fourier transform on the time axis to acquires x-t space data (first time-series space data).

The reconstruction method used in the second modification of the first embodiment is not limited to SENSE and k-t SENSE. For example, x-t space data may be reconstructed using other methods, such as regularization and compressed sensing, using prior knowledge.

As described, according to the second modification of the first embodiment, even when time-series k-space data that is sampled by decimating data in order to shorten the imaging time is acquired, it is possible to acquire correct flow velocity data and thus improve the image quality of a magnitude image.

Third Modification of First Embodiment

For a third modification of the first embodiment, a method will be described in which, when time-series k-space data that is sampled by decimating data in order to shorten the imaging time, time-series x-space data (first time-series x-space data) corresponding to that without decimation is constructed, using a method different from that of the second modification.

According to a third modification of the first embodiment, when time-series k-space data is time-series k-space data at first intervals in a k-space, the conversion unit 122a estimates time-series space data acquired at second intervals each smaller than the first interval in the k-space and, from the estimated time-series k-space data, acquires first time-series x-space data.

In other words, according to the third modification of the first embodiment, for example, time-series x-space data not decimated is simply estimated by interpolating the decimated data and the estimated time-series x-space data is output as first time-series x-space data to the magnitude image generator 122b and the phase image generator 122c.

For example, according to the third modification of the first embodiment, the conversion unit 122a estimates not-sampled k-t space data of each channel from sampled k-t space data of each channel and acquires k-t space data equivalent to data acquired by full-sampling. The conversion unit 122a then acquires x-t space data of each channel by applying, for example, the Fourier transform in the spatial direction to the k-t space data equivalent to data acquired by full-sampling.

As described above, according to the third modification of the first embodiment, even when time-series k-space data sampled by decimating data in order to shorten the imaging time is acquired, it is possible to obtain correct flow velocity data and thus improve the image quality of a magnitude image.

Fourth Modification of First Embodiment

The first embodiment and the first to third modifications of the first embodiment have been described on the premise that the first and second filters, whose characteristics are determined in advance, are used, due to the determination of Range 1 and Range 2 by a user or a user of the MRI apparatus before imaging. For such manual setting, parameter values may be initially set in advance or may be set from subject P to another. The characteristics of the first filter and the characteristics of the second filter may be automatically determined by using various methods to be described below.

According to a fourth modification of the first embodiment, the controller 126 acquires given information and determines, based on the given information, a first parameter and a second parameter. The first parameter determines characteristics of the first filter. The second parameter determines characteristics of the second filter. The controller 126 notifies the magnitude image generator 122b of the first parameter and notifies the phase image generator 122c of the second parameter.

For example, the controller 126 acquires, as the above-described given information, at least one of information on imaging conditions and information on a subject P to be imaged and determines the first parameter and the second parameter. The information on the imaging conditions represents, for example, the type of pulse to be applied, the pulse sequence, and setting of a site to be imaged and a region of interest in the site to be imaged. The information on the subject P to be imaged represents, for example, the blood pressure of the patient P just before imaging, the heart rate, sex, height, weight, etc.

For example, according to a site to be imaged (an internal organ to be imaged), the user of the MRI apparatus 100 empirically calculates a value of the first parameter and a value of the second parameter that can respectively improve the quality of a magnitude image and the quality of a phase image and stores, in advance, the calculated values in association with the site to be imaged in the storage 123. The controller 126 acquires, from the storage 123, the value of the first parameter and the value of the second parameter corresponding to the site to be imaged that is input as examination information and notifies the magnitude image generator 122b and the phase image generator 122c of the values.

The values of the first and second parameters stored in the storage 123 may be previously set according to an arbitrary number of sets of information selected from multiple sets of information included in the information on the imaging conditions, such as, in addition to the above-described example, "a type of a pulse to be applied", "a pulse sequence", "a site to be imaged and a type of a pulse to be applied", "a site to be imaged and a pulse sequence", or "a site to be imaged, a type of a pulse to be applied, and a pulse sequence".

The values of the first and second parameters stored in the storage 123 may be previously set according to an arbitrary number of sets of information selected from, in addition to the above-described example, various measured values measured just before the subject P is imaged. Alternatively, the values of the first and second parameters stored in the storage 123 may be previously set according to an arbitrary number of sets of information that is a combination of multiple sets of information included in the information on imaging conditions and various measured values measured just before the subject P is imaged.

Alternatively, according to the fourth modification of the first embodiment, when the values of the parameters of the filters are varied according to the site to be imaged, for example, the first and second parameters may be determined according to a peak flow (maximum flow velocity) of a fluid (such as blood) that flows through a site to be imaged (an internal organ to be imaged). For example, since the diameter of the blood vessel and the distance from the heart differ depending on whether the site to be imaged is the aorta (heart), the pulmonary artery (lung), or the carotid (cervix), the magnitude of the peak flow (maximum flow velocity) that is the maximum value of the flow velocity as a function of time differs. For this reason, the controller 126 varies the strength of the first and second filters in accordance with the peak flow of the site to be imaged. For example, when the flow velocity or the maximum flow velocity is large, it is preferable that the second filter be a strong filter, narrowing Range 2. On the contrary, when the flow velocity or the maximum flow velocity is small, it is preferable that the second filter be a weak filter, extending Range 2. As for the first filter, the filter characteristics may be changed or not according to the peak flow of the site to be imaged.

For example, setting information in which the value of an average peak flow at a site to be imaged, the value of the first parameter, and the value of the second parameter are associated is stored in the storage 123. By acquiring the value of the first parameter and the value of the second parameter corresponding to the site to be imaged in the subject P, the controller 126 determines the characteristics of the first filter and the second filter.

The case has been described where the controller 126 automatically determines the filter characteristics by using the pre-set setting information representing the filter characteristics; however, in the modification, the controller 126 may calculate the values of the first and second parameters in accordance with the method exemplified below.

For example, the controller 126 acquires the value of the average flow velocity at a site to be imaged in a subject P that is measured by using Doppler measurement. Alternatively, for example, the controller 126 estimates the value of the average flow velocity at the site to be image in the subject P on the basis of information, such as the blood pressure and the heart rate.

For example, the equation that "the blood pressure=the heart rate×one systolic output×the vascular resistance" holds, and accordingly the controller 126 calculates one systolic output from the blood pressure and heart rate of the subject P. Since "the amount of blood=the average flow velocity×the cross-sectional area of a blood vessel" holds, the controller 126 estimates the average flow velocity from the amount of blood calculated from the one systolic output and the cross-sectional area of an average blood vessel in the site to be imaged. For phase image generation, it is possible to empirically obtain an equation regarding relationship between the frequency value of data that needs to be preserved and the average flow velocity. From the equation and the average flow velocity of the site to be imaged in the subject P, the controller 126 can calculate the value of the second parameter that determines the characteristics of the second filter.

Alternatively, for example, the controller 126 may calculate the values of the first and second parameters from a magnitude image that is generated without performing first filter processing (hereinafter, the first magnitude image) and a phase image that is generated without performing second filter processing (hereinafter, the first phase image). In this case, as the first stage, the magnitude image generator 122b generates magnitude information from first time-series x-space data. Furthermore, as the first stage, the phase image generator 122c generates phase information from first time-series x-space data. The controller 126 then acquires the magnitude information and the phase information as the above-described given information and determines the first and second parameters.

For example, the controller 126 estimates the magnitude of the noise in each of the first magnitude image and the first phase image. For example, the controller 126 calculates the value of the first parameter from the magnitude of the noise in the first magnitude image and calculates the value of the second parameter from the magnitude of the noise in the first phase image. In the modification, according to an instruction of the controller 126, the phase image generator 122c may generate time-series data of flow velocity from the first phase image and the controller 126 may calculate the value of the second parameter from the magnitude of the noise in the time-series data of flow velocity.

The controller 126 can estimate the magnitude of noise from, for example, the magnitude of noise at a location where the MR signal is small. The controller 126 can, as for the phase image, for example at time-series data of flow velocity, also estimate the magnitude of noise from the magnitude of noise after removal of components that vary smoothly as the function of time.

As described above, according to the fourth modification of the first embodiment, such filter parameters that can obtain correct flow velocity data and that can increase an image quality of a magnitude image are automatically calculated, thereby convenience for the users being increased.

Second Embodiment

Figure 9:
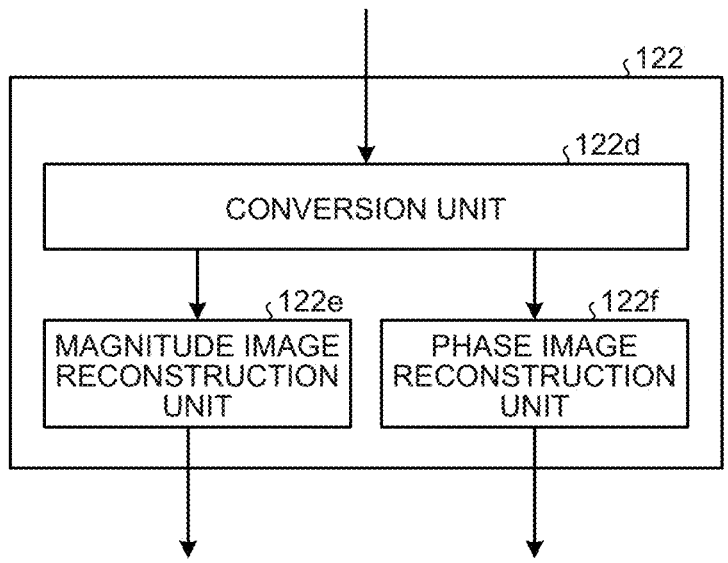
FIG. 9 is a block diagram representing a configuration of an image generator according to a second embodiment.

In a second embodiment, the second method described for the second modification of the first embodiment (the method of using different sets of reconstruction processing for magnitude and phase images in the processing for reconstructing decimated data) will be described with reference to FIG. 9, etc. FIG. 9 is a block diagram representing a configuration of an image generator according to a second embodiment.

The MRI apparatus 100 according to the second embodiment is different from the MRI apparatus 100 according to the first embodiment shown in FIG. 1 in that, as shown in FIG. 9, the image generator 122 includes a conversion unit 122d instead of the conversion unit 122a, includes a magnitude image reconstruction unit 122e instead of the magnitude image generator 122b, and includes a phase image reconstruction unit 122f instead of the phase image generator 122c.

The conversion unit 122d performs a conversion processing of converting time-series k-space data (time-series k-space data acquired in a decimated k-space) into time-series x-space data and thereafter to perform a conversion processing of t-f conversion, thereby generating first x-f space data. The time-series x-space data is a time-series data on an x-space representing a spatial position. For example, the time-series k-space data is time-series k-space data by decimating data in accordance with a "reduction factor R".

The magnitude image reconstruction unit 122e reconstructs second x-f space data by a given image reconstruction method. The second x-f space data are obtained by unfolding the first x-f space data. Each of data points of the first x-f space data within a first reconstruction range on the f-axis is a reconstruction target range. The magnitude image reconstruction unit 122e further generates a magnitude image from x-t space data. The x-t space data is obtained by applying inverse transformation of the t-f conversion to the second x-f space data.

The phase image reconstructing unit 122f reconstructs third x-f space data by the given image reconstruction method. The third x-f space data is obtained by unfolding the first x-f space data. Each of data points of the first x-f space data within a second reconstruction range on the f-axis is a reconstruction target range. The second reconstruction range is different from the first reconstruction range. Then the phase image reconstructing unit 122f generates a phase image from x-t space data. The x-t space data is obtained by applying inverse transformation of the t-f conversion to the third x-f space data.

First of all, a case of employing k-t SENSE as the given reconstruction method being taken as an example, the technical implication of using different reconstruction processing for a magnitude image and a phase is illustrated.

It goes without saying, however, that the reconstruction method is not limited to k-t SENSE. Furthermore, it is not limited to parallel imaging for acquiring data with multiple coils. Furthermore, the given reconstruction method may be used for data acquired from a single coil by decimation.

In order to perform fast imaging, imaging may be performed by acquiring data by decimating data in a k-space instead of acquiring data by using multiple coils. In this case, the data points in the k-space are insufficient by themselves; however, because data is acquired with multiple coils, it is possible to reconstruct data corresponding to data acquired without decimating data in the k-space by using, for example, a given reconstruction method, such as SENSE. For the time-series k-space data, for example, there is a reconstruction method referred to as k-t SENSE for performing reconstruction in an x-f space.

When an image is reconstructed, in general, a reconstruction error occurs. For example, a reconstruction error occurs when data points having a low signal magnitude amid a large noise are used for the reconstruction. A reconstruction error also occurs when the geometry factor (g-factor) of the system is large. As the reconstruction generally involves a reconstruction error as described above, in some cases, the output image turns out to have less noise when reconstructing using only a portion of the data points than using all the data points.

Indeed, when an image is reconstructed by using k-t SENSE in an x-f space, by setting only a range where the frequency f is small is set as an image reconstruction target range, the image reconstruction error may be reduced.

Which region of f should be set for the image reconstruction target range differs depending on the characteristics of the image reconstruction target. If the image reconstruction target range is too small, a newly arising error because of data points being excluded from the image reconstruction target becomes greater. On the other hand, if the image reconstruction target range is too large, the image reconstruction error becomes greater. In consideration of both of them, the preferable image reconstruction range is determined. The preferable image reconstruction range differs depending on the characteristics and the purpose of use of the image to be reconstructed.

According to the second embodiment, image reconstruction is performed on the data in a first image reconstruction range (hereinafter, also referred to as Range 3) in the image reconstruction processing for generating a magnitude image, and image reconstruction is performed on the data in a second image reconstruction range (hereinafter, also referred to as Range 4) different from the first image reconstruction range in the image reconstruction processing for generating a phase image. According to the second embodiment, it is preferable that the second image reconstruction range (Range 4) be larger than the first image reconstruction range (Range 3). Furthermore, according to the second embodiment, the first image reconstruction range and the second image reconstruction range may be the range before the first folding occurrence with respect to f. Furthermore, for example, the second image reconstruction range may be the entire range with respect to f.

Figure 10:
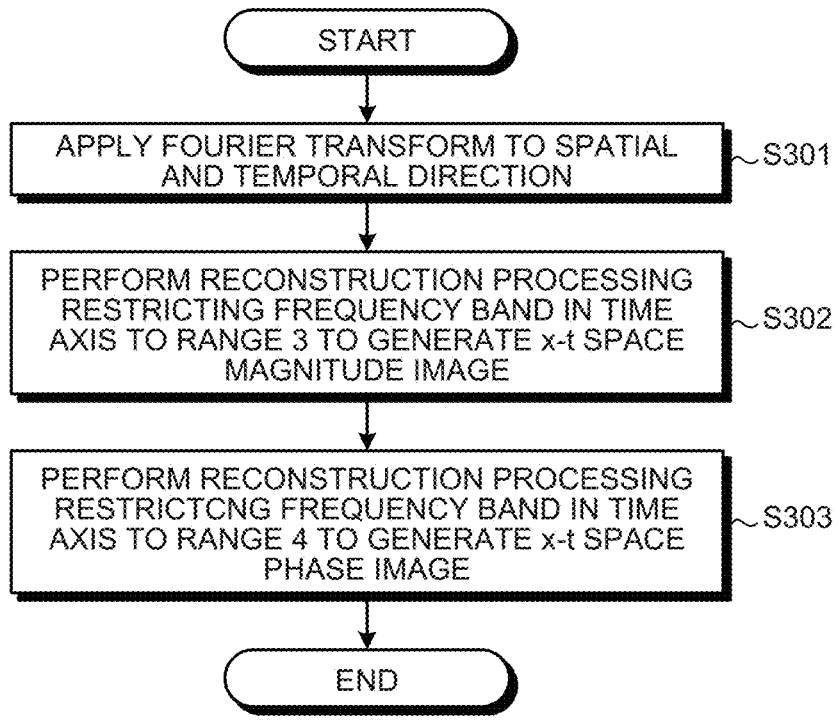
FIG. 10 is a flowchart of an exemplary procedure of processing performed by the image generator according to the second embodiment.

With reference to the flowchart in FIG. 10, exemplary contents of the processing performed by the image generator according to the second embodiment will be described. FIG. 10 is a flowchart of an exemplary procedure of processing performed by the image generator according to the second embodiment. The flowchart shown in FIG. 10 corresponds to the processing performed by the image generator 122 according to the second embodiment at step S104 shown in FIG. 5.

As shown in FIG. 10, first, the conversion unit 122d acquires x-f space data of each channel (first x-f space data) by reading time-series k-space data of one or multiple channels from the storage 123 and applying the Fourier transform in the spatial and temporal direction to the time-series k-space data of each channel (step S301). In other words, the conversion unit 122d obtains x-f space data (first x-f space data) by applying the Fourier transform to the temporal direction as well as applying the Fourier transform to the spatial direction. The conversion unit 122d passes down the acquired x-f space data (first x-f space data) of each of the channels to the magnitude image reconstruction unit 122e and the phase image reconstruction unit 122f.

The magnitude image reconstruction unit 122e generates x-t space magnitude image by performing reconstruction processing, restricting the reconstruction processing to Range 3 of the frequency band of the f-axis, on the x-f space data (first x-f space data) of each of the channels acquired at step S301 (step S302).

Specifically, the magnitude image reconstruction unit 122e applies spatial and temporal unfolding processing, such as k-t SENSE, to the x-f space data (first x-f space data) of each channel obtained at step S301. The magnitude image reconstruction unit 122e restricts the reconstruction range in the f-axis that is the frequency components of temporal changes to Range 3 (first reconstruction area) including direct current components. The magnitude image reconstruction unit 122e then obtains an x-t space magnitude image by applying the inverse Fourier transform on the time axis to the unfolded x-f space data (second x-f space data).

Subsequent to step S302 or in concurrent with step S302, the phase image reconstruction unit 122f generates an x-t space phase image by performing, on the x-f space data (first x-f space data) of each channel acquired at step S301, reconstruction processing restricting the frequency band in the time axis (t-axis) to Range 4 of frequency band in the f-axis (step S303).

Specifically, the phase image reconstruction unit 122f applies, spatial and temporal unfolding processing, such as k-t SENSE, to the x-f space data (first x-f space data) of each of the channels acquired at step S301. The phase image reconstruction unit 122f restricts the range of reconstruction in the f-axis representing the frequency components of time conversion to Range 4 (second reconstruction range). The Range 4 (second construction range) is larger than Range 3 (first reconstruction range). The Range 3 (first reconstruction range) includes direct current components. The phase image reconstruction unit 122f then acquires an x-t space phase image by applying the inverse Fourier transform on the time axis to the unfolded x-f space data (third x-f space data).

The relationship between Range 3 (first reconstruction range) and Range 4 (second reconstruction range) is similar to the relationship between Range 1 and Range 2 in the first embodiment and it is preferable that Range 3<Range 4 as for the relationship. For Range 4, the whole frequency band may be set and, in that case, reconstruction processing is performed with respect to all frequency bands at step S303. Each of the Range 3 and Range 4 needs to be changed of the set values according to the subject P. However, initially-set values may be used. For example, similarly to automatic setting of Range 1 and Range 2 described in the fourth modification of the first embodiment, the controller 126 may automatically determine the set values of each of Range 3 and Range 4.

Furthermore, Range 3 and Range 4 described above may be a single range covering direct current components or may be a range including direct current components and divided into multiple ranges. Also in this case, it is preferable that Range 4 cover higher frequency components than Range 3.

As described above, according to the second embodiment, by independently setting reconstruction ranges in the frequency axis representing the temporal change between phase image reconstruction and magnitude image reconstruction, it is possible to correctly calculate temporal changes in the flow velocity and suppress reconstruction noise, thereby improving the image quality of the magnitude image (time-series magnitude images).

First Modification of Second Embodiment

In the second embodiment, Range 3 (first reconstruction range) and Range 4 (second reconstruction range) are dealt as fixed values. Alternatively, they may be dynamically changed during the reconstruction. According to a first modification of the second embodiment a method of calculating a final output image by repeatedly performing interactive operations at multiple steps is used as an image reconstruction method. In this method, according to the results of the operations at each of the multiple steps, the first reconstruction range (Range 3) and the second reconstruction range (Range 4) are dynamically changed at each of the multiple steps.

For example, at steps S302 and S303, x-t space data (the second x-f space data and the third x-f space data) is reconstructed by performing iteration processing by using a method, such as regularization and compressed sensing, using prior knowledge. Range 3 and Range 4 are changed per iteration processing.

According to the first modification of the second embodiment, by dynamically changing the reconstruction ranges, it is possible to correctly calculate temporal changes in the flow velocity, suppress reconstruction noise, and improve the image quality of time-series magnitude images and also to reconstruct magnitude and phase images as appropriate.

Other Embodiment

Embodiments are not limited to the above-described embodiments.

(Image Processing Apparatus)

For the above-described embodiments, the cases have been described where the MRI apparatus 100 that is a medical image diagnosis apparatus performs various types of processing; however, embodiments are not limited to them. For example, instead of the MRI apparatus 100, an image processing apparatus or an image processing system including the MRI apparatus 100 and an image processing apparatus may perform the above-described various types of processing. The image processing apparatus may be, for example, a work station, an an image storage device (image server) and a viewer of a picture archiving and communication system (PACS), or various devices of an electronic medical record system. In this case, for example, the image processing apparatus receives k-space data acquired by the MRI apparatus 100 from the MRI apparatus 100, from an image server via a network, or from an input from an operator via a recording medium and stores the k-space data in the storage. The image processing apparatus may perform the above-described various types of processing (such as the processing performed by the conversion unit 122a, the magnitude image generator 122b, and the phase image generator 122c) on the k-space data that is stored in the storage.

(Program)

It is possible to execute the instructions shown in the processing procedures represented in the above-described embodiments based on a program that is software. A versatile calculator system may store the program in advance and, by reading the program, it is possible to implement the same effects as those from the MRI apparatus and the image processing apparatus according to the above-described embodiments. The instructions described according to the embodiment are recorded as a computer-executable program in a magnetic disk (such as a flexible disk or a hard disk), an optical disc (such as a CD-ROM, a CD_R, a CD_RW, a DVD-ROM, DVD±R, or DVD±RW), a semiconductor memory, or a recording medium equivalent to them. Any format is used to store the data as long as a recording medium that a computer or an incorporated system can read is used. By reading the program from the recording medium and causing the CPU to execute the instructions described in the program according to the program, the computer can implement the same operations as those of the MRI apparatus or the image processing apparatus according to the above-described embodiments. Needless to say, when acquiring or reading the program, the computer may acquire or read the program via a network.

Alternatively, an operating system (OS) running in the computer according to the instructions of the program installed in the computer or an incorporated system from the storage medium, database management software, or middleware (MW), such as a network, may perform a part of the processing for implementing the above-described embodiment.

Furthermore, the storage medium is not limited to a medium independent of the computer or the incorporated system. The storage medium includes a recording medium that stores or temporarily stores the downloaded program transmitted via a local area network (LAN) or the Internet.

The storage medium is not limited to one storage medium. The storage medium according to the embodiment covers a case where the processing according to the embodiment is performed from multiple media, and any medium configuration may be employed.

The computer or the incorporated system according to the embodiments is for performing each set of processing according to the above-described embodiment in accordance with the program stored in the storage medium and may have any configuration, i.e., for example, it may be a device including any single one of a personal computer, microcomputer, and the like, or a system in which multiple devices are connected via a network.

The computer according to the embodiment is not limited to personal computers and includes, for example, an operation processing device and a microcomputer that an information processing device includes, i.e., is a general term of devices and apparatuses capable of realizing the embodiments by a program.

Although it is obvious to those skilled in the art, the Fourier transform and inverse Fourier transform may be respectively replaced with the inverse Fourier transform and Fourier transform in all the above described embodiments. Instead of the Fourier transform, the Fourier series expansion may be performed.

According to at least one of the above-described embodiments, it is possible to obtain correct flow velocity data and improve the quality of a magnitude image.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image processing apparatus comprising processing circuitry including at least one processor, the processing circuitry being configured to:
    convert time-series k-space data into first time-series x-space data, the x-space representing a spatial position;
    generate a magnitude image from second time-series x-space data, the second time-series x-space data being acquired by applying a first filter to a magnitude image based on the first time-series x-space data; and
    generate a phase image from third time-series x-space data, the third time-series x-space data being acquired by applying, to a phase image based on the first time-series x-space data, a second filter that is different from the first filter.

2. The apparatus according to claim 1, wherein the processing circuitry is further configured to:
    acquire information related to at least one of (a) imaging conditions and/or (b) a subject to be imaged;
    determine, based on the acquired information, a first parameter that determines characteristics of the first filter and a second parameter that determines characteristics of the second filter;
    notify the magnitude image generating circuitry of the first parameter; and
    notify the phase image generating circuitry of the second parameter.

3. An image processing apparatus comprising processing circuitry including at least one processor, the processing circuitry being configured to:
    convert time-series k-space data into first time-series x-space data, the x-space representing a spatial position;
    generate a magnitude image from second time-series x-space data, the second time-series x-space data being acquired by applying a first filter to the first time-series x-space data; and
    generate a phase image from third time-series x-space data, the third time-series x-space data being acquired by applying, to the first time-series x-space data, a second filter that is different from the first filter,
wherein
    the first filter and the second filter are filters operating on an f-axis that is different from a t-axis representing a time axis, and
    wherein the processing circuitry being further configured to:
        acquire x-f space data by performing t-f conversion to the first time-series x-space data, the t-f conversion converting the t-axis to the f-axis;
        after applying the first filter on the x-f space data, apply inverse transformation of the t-f conversion, thereby acquiring the second time-series x-space data;
        perform the t-f conversion to the first time-series x-space data, thereby acquiring the x-f space data; and
        apply, after applying the second filter on the x-f space data, the inverse transformation of the t-f conversion, thereby generating the third time-series x-space data.

4. An image processing apparatus comprising processing circuitry including at least one processor, the processing circuitry being configured to:
    convert time-series k-space data into first time-series x-space data, the x-space representing a spatial position;
    generate a magnitude image from second time-series x-space data, the second time-series x-space data being acquired by applying a first filter to the first time-series x-space data; and
    generate a phase image from third time-series x-space data, the third time-series x-space data being acquired by applying, to the first time-series x-space data, a second filter that is different from the first filter,
wherein the first filter and the second filer are data smoothing filters on a time axis, and
wherein the processing circuitry is further configured to:
    apply the first filter on the first time-series x-space data on the time axis, thereby acquiring the second time-series x-space data; and
    apply the second filter on the first time-series x-space data on the time axis, thereby acquiring the third time-series x-space data.

5. An image processing apparatus comprising processing circuitry including at least one processor, the processing circuitry being configured to:
    convert time-series k-space data into first time-series x-space data, the x-space representing a spatial position;
    generate a magnitude image from second time-series x-space data, the second time-series x-space data being acquired by applying a first filter to the first time-series x-space data; and
    generate a phase image from third time-series x-space data, the third time-series x-space data being acquired by applying, to the first time-series x-space data, a second filter that is different from the first filter, wherein the first filter is a stronger data smoothing filter than the second filter.

6. A magnetic resonance imaging apparatus comprising:
an MRI system to acquire time-series k-space data;
one or more processor-accessible media comprising processor-executable instructions that, when executed, cause a device to perform actions comprising:
converting the time-series k-space data acquired by the MRI system into first time-series x-space data, the x-space representing a spatial position;
generating a magnitude image from second time-series x-space data, the second time-series x-space data being acquired by applying a first filter to the first time-series x-space data; and
generating a phase image from third time-series x-space data, the third time-series x-space data being acquired by applying, to the first time-series x-space data, a second filter that is different from the first filter, wherein the first filter is a stronger data smoothing filter than the second filter is.

7. The apparatus according to claim 6, wherein the processor-executable instructions, when executed, cause the device to perform further actions comprising:
acquiring the time-series k-space data by using a pulse sequence configured to apply a given bipolar gradient field based on a phase contrast method and
calculating a flow velocity on a basis of the phase image.

* * * * *